United States Patent
Leonard (10) Patent No.: US 7,230,497 B1
(45) Date of Patent: Jun. 12, 2007

(54) SYSTEM FOR CONTROLLING FREQUENCY OF OSCILLATOR

(75) Inventor: Jason Leonard, San Mateo, CA (US)

(73) Assignee: Linear Technology Corporation, Milpitas, CA (US)

(*) Notice: Subject to any disclaimer, the term of this patent is extended or adjusted under 35 U.S.C. 154(b) by 75 days.

(21) Appl. No.: 11/154,548

(22) Filed: Jun. 17, 2005

(51) Int. Cl.
*H03L 7/00* (2006.01)

(52) U.S. Cl. .................... 331/16; 331/10; 331/1 R; 331/108 C (58) Field of Classification Search ............ 331/108 C, 331/10, DIG. 2, 1 R, 16
See application file for complete search history.

(56) References Cited

U.S. PATENT DOCUMENTS

| | | | | |
|---|---|---|---|---|
| 5,877,656 | A * | 3/1999 | Mann et al. ............. | 331/16 |
| 6,803,827 | B1 * | 10/2004 | Kenney et al. .......... | 331/16 |
| 6,812,797 | B1 * | 11/2004 | De Veirman et al. ..... | 331/11 |
| 6,888,413 | B1 * | 5/2005 | Adams et al. ........... | 331/17 |
| 7,012,471 | B2 * | 3/2006 | Lyden et al. ............ | 331/16 |

OTHER PUBLICATIONS

LTC3701; LT/TP 0403 1K; "2-Phase, Low Input Voltage, Dual Step-Down DC/DC Controller"; Linear Technology Corporation; c. 2002; pp. 1-20; USA.

LTC3412; LT/TP 0203 2K; "2.5A, 4MHz, Monolithic Synchronous Step-Down Regulator"; Linear Technology Corporation; c. 2002; pp. 1-20; USA.

LTC1735; LT/TP 0104 REV C 1K; "High Efficiency Synchronous Step-Down Switching Regulator"; Linear Technology Corporation; c. 1998; pp. 1-32; USA.

* cited by examiner

*Primary Examiner*—Robert Pascal
*Assistant Examiner*—Levi Gannon
(74) *Attorney, Agent, or Firm*—McDermott Will & Emery LLP (57) ABSTRACT

System for controlling the frequency of an oscillator. A first circuit is coupled to the oscillator and arranged for receiving an externally provided clock signal at a first input node. A second circuit coupled to the oscillator is arranged for receiving an externally provided frequency reference input at a second input node. The first circuit uses the clock signal received at the first input node to control the frequency of the oscillator. In absence of a clock signal received at the first node, the second circuit uses the frequency reference input received at the second input node to control the frequency of the oscillator. The frequency reference input is selectively at one of (a) a first or second fixed voltage level designating a first or second oscillator frequency, and (b) a variable signal level designating a frequency between the first and second oscillator frequencies.

13 Claims, 9 Drawing Sheets

SYSTEM FOR CONTROLLING FREQUENCY OF OSCILLATOR

TECHNICAL FIELD

This disclosure is related generally to frequency control applicable for integrated circuits and other circuit implementations, and more particularly to doing so with the minimum number of input nodes, terminals or pins necessary therefor.

BACKGROUND

Figure 1:
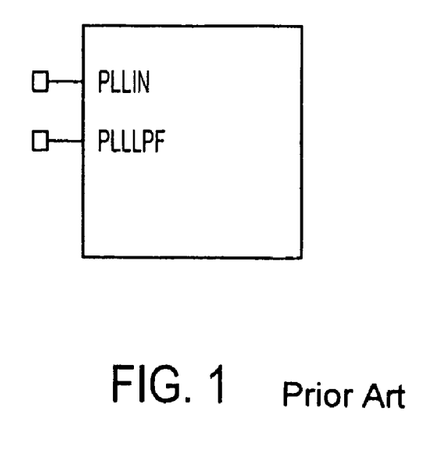
FIG. 1 is a schematic view of an IC package including a phase-locked loop having PLLIN and PLLLPF pins.

It has become common to integrate a phase-locked loop (PLL) onto an integrated circuit (IC) in order to synchronize the operating frequency of the PLL, and hence the integrated circuit, to an external clock signal ("PLL mode"). As shown in FIG. 1, the integration of a PLL generally requires an IC to have two additional pins (alternatively termed "terminals" or "nodes"): a PLLIN pin for an external clock input and a PLLLPF pin for connection of a PLL frequency compensation/loop filter such as an R-C network. Minimizing pin count, however, is preferred in order to reduce packaging size and complexity, and improve yield.

Figure 2:
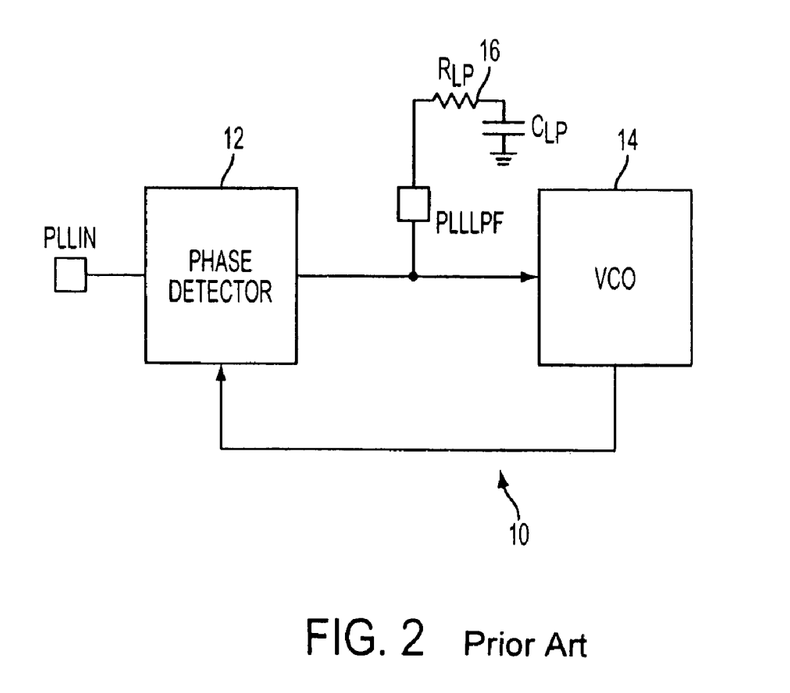
FIG. 2 is a block diagram exemplary showing a phase-locked loop implemented in the package shown in FIG. 1.

FIG. 2 shows an example of a conventional PLL of a type implemented in such circuits. A PLL 10 generally comprises a phase detector 12, and voltage-controlled oscillator (VCO) 14 connected to phase detector 12 through the PLLLPF pin to which frequency compensation external filter 16 comprising a resistor $R_{LP}$ and capacitor $C_{LP}$ is connected. Phase detector 12 compares the phase and frequency of the external clock from the PLLIN pin with those of an internal clock generated by VCO 14. The output of phase detector 12 ("error signal") may be produced by a pair of complementary current sources that charge or discharge external filter 16 connected to the PLLLPF pin. The PLLLPF pin is provided to PLL 10 so that a user can choose a desired resistance and capacitance to set the PLL's characteristics.

If the external frequency is greater than the internal frequency, current is sourced continuously to filter 16, pulling up the PLLLPF pin. When the external frequency is less than that of the internal frequency, current is sinked continuously, pulling down the PLLLPF pin. If the external and internal frequencies are the same but exhibit a phase difference, current is sourced or sinked for an amount of time corresponding to the phase difference. The voltage on the PLLLPF pin is adjusted until the phase and frequency of the internal clock become identical to those of the external clock. At the stable operating point, the phase comparator output is high impedance and capacitor $C_{LP}$ holds the voltage. Resistor $R_{LP}$ and capacitor $C_{LP}$ of the external filter 16 smooth out the current pulses from phase detector 12 and provide a stable input to VCO 14. Resistor $R_{LP}$ and capacitor $C_{LP}$ determine how fast the loop acquires lock.

Figure 3:
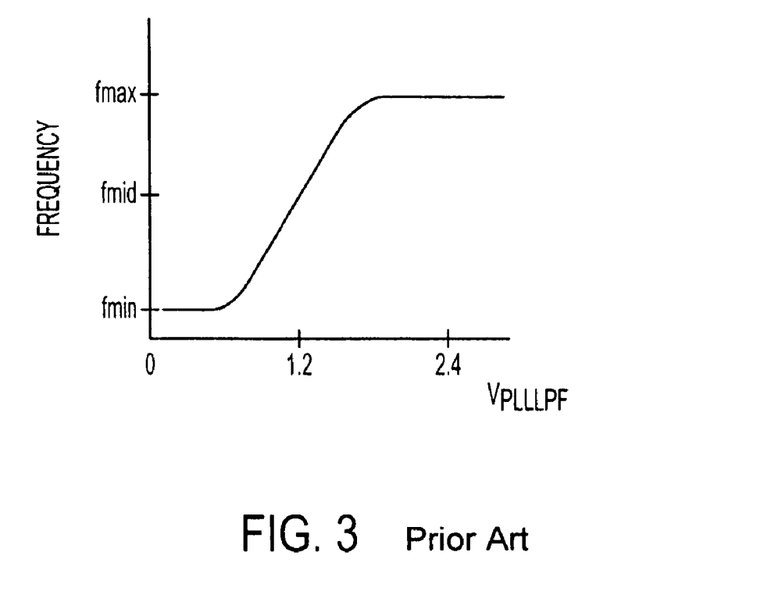
FIG. 3 is a graph exemplary showing a relationship between a voltage on PLLLPF pin and a frequency of an internal clock to be generated by a voltage-controlled oscillator.

When the IC is not synchronized to the external clock, the frequency of the internal clock may be set by applying a DC voltage to the PLLLPF pin ("tri-state mode"). For example, it has been known to use the PLLLPF pin to digitally select the integrated circuit's operating frequency by tying the PLLLPF to a high voltage supply (e.g., $V_{CC}$) or a low voltage supply (e.g., GND) to select maximum frequency $f_{max}$ or minimum frequency $f_{min}$ of VCO 14. FIG. 3 shows an example of the relationship between a voltage on the PLLLPF pin and frequency of the internal clock to be generated by VCO 14. The level of voltage on the PLLLPF pin dictates the frequency of the internal clock.

The PLLLPF pin can also be floated (left in a high impedance state) to select a mid-range frequency $f_{mid}$ shown in FIG. 3. This mid-range frequency $f_{mid}$ can be achieved internally on the IC, for example, by weakly tying the PLLLPF pin through a high resistance or weak active device to a voltage reference equal to the center of the VCO's voltage range. Accordingly, the PLLLPF pin can be used as a digital (or tri-state) pin to select one of two (or three) discrete operating frequencies, while requiring no additional external components. The following table shows a relationship between inputs to PLLIN and PLLLPF pins and a frequency of the internal clock.

| PLLIN | PLLLPF | Frequency |
| --- | --- | --- |
| External clock | R-C to GND | Phase-locked to external clock |
| — | Tied to GND | $f_{min}$ |
| — | Float | $f_{mid}$ |
| — | Tied to $V_{CC}$ | $f_{max}$ |

Alternatively, the PLLLPF pin can be used as an analog voltage input to select any of the VCO's frequencies (see FIG. 3). This requires a precision external reference to be generated, for example, by a resister divider on a power supply or other voltage reference. However, even if a precision voltage reference of the desired value is readily available, the gain (or slope) of the curve in FIG. 3 (the VCO's linear region) typically varies from part to part (due to manufacturing variations) and over temperature. Therefore, a voltage to be applied to the PLLLPF pin needs to be generated accurately.

The PLL mode and tri-state mode are described in the datasheet of commercially available LTC 3701 2-phase, low input voltage, dual step-down DC/DC controllers, manufactured by Linear Technology Corporation, incorporated herein by reference.

Figure 4:
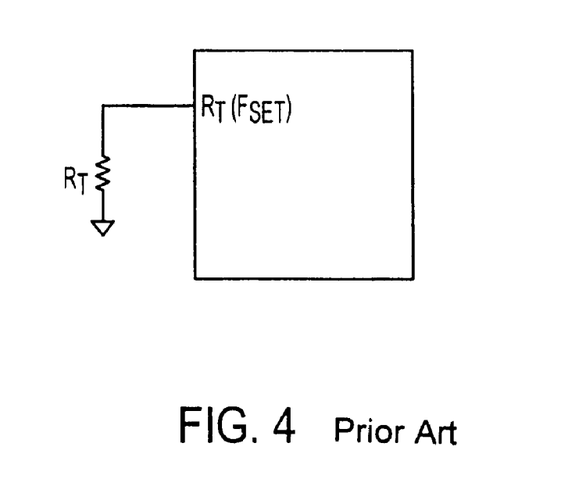
FIG. 4 is a schematic view of an IC package with a frequency select/set pin to which a resister is connected.
Figure 5:
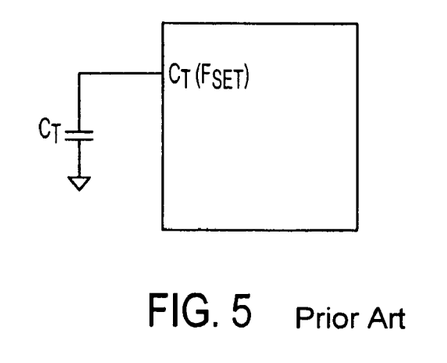
FIG. 5 is a schematic view of an IC package with a frequency select/set pin to which a capacitor is connected.

FIGS. 4 and 5 show another common way to select an ICs operating frequency, in which a resistor $R_T$ or capacitor $C_T$ is connected between a frequency select/set pin (commonly denoted as "$F_{SET}$," "$R_T$," or "$C_T$" pin) and ground (or a supply rail). This allows for the IC's frequency to be selected in an analog manner (based on the value of resistor $R_T$ or capacitor $C_T$) from a continuous range of possible frequencies ("passive element setting mode").

Figure 6:
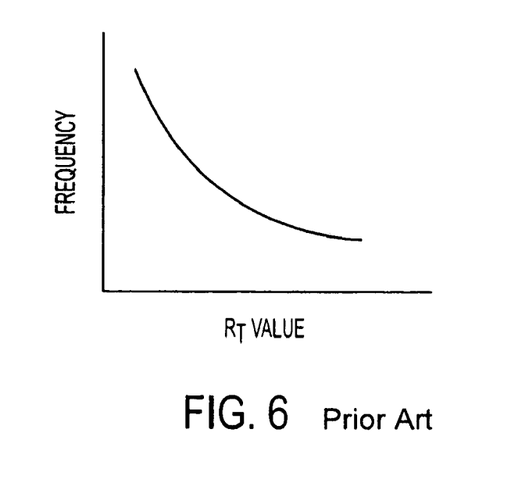
FIG. 6 shows a relationship between a frequency of the internal clock to be generated and resistance.

For example, a voltage is applied across resistor $R_T$, and a scaled version of the resultant current is then used as the input current of a current controlled oscillator ("ICO"), an output frequency of which is a function (usually proportional) of the input current. The frequency of the internal clock to be generated by the ICO can be selected relatively precisely, since the voltage forced across resistor $R_T$ can be, or be derived from, a precision voltage reference such as a bandgap reference. The value of an external resistor can also be very accurate (e.g., 1% resistors are common). FIG. 6 shows the relationship between frequency of the internal clock to be generated and value of resister $R_T$. When the value of resistor $R_T$ increases, the current flowing in the resistor decreases. Therefore, the frequency of the internal clock to be generated by the ICO decreases. When the value of resistor $R_T$ decreases, the current flowing in the resistor increases. Therefore, the frequency of the internal clock to be generated by the ICO increases.

An example using resistor $R_T$ is described in the datasheet of commercially available LTC 3412 monolithic synchronous step-down regulators, manufactured by Linear Technology Corporation, incorporated herein by reference.

Capacitor $C_T$ typically serves as a timing element for the IC's oscillator, such that the IC's frequency is inversely proportional to the value of the capacitor. Using a capacitor $C_T$ for this purpose is described in the datasheet of commercially available LTC 1735 high efficiency synchronous step-down switching regulator, manufactured by Linear Technology Corporation, incorporated herein by reference.

This disclosure addresses the desirability of a combination of the PLL mode, tri-state mode and passive element setting mode into an IC, with minimum pins (terminals, nodes), for controlling those modes.

SUMMARY

The disclosure describes controlling operating frequency of integrated circuits. In one aspect, a system configured for controlling the frequency of an oscillator may include a first circuit coupled to the oscillator and arranged for receiving an externally provided clock signal at a first input node to control the frequency of the oscillator, and a second circuit coupled to the oscillator and arranged for receiving an externally provided frequency reference input at a second input node to control the frequency of the oscillator. The frequency reference input is selectively at one of (a) a first or second fixed voltage of level designating respectively a first or second oscillator frequency, and (b) a variable signal designating an oscillator frequency.

The second circuit may use the frequency reference input received at the second input node to control the frequency of the oscillator in absence of a clock signal received at the first node. The system may further include a signal detector for detecting the clock signal at the first node, activating the first circuit when the clock signal is detected, and activating the second circuit when no clock signal is detected.

The second input node may be adapted to be connected to a filter when the externally provided clock signal is provided at the first input node. The first circuit can be coupled to the oscillator through the second input node and configured for detecting a phase/frequency difference between the externally provided clock signal and an internal clock signal to be generated by the oscillator. The first circuit, filter and oscillator constitute a phase-locked loop to synchronize the internal clock signal to the externally provided clock signal.

The second circuit may control the frequency of the oscillator to be the mid range of the first and second oscillator frequencies if no frequency reference input is received at the second input node. The first and second fixed voltages may be a power supply voltage and ground, and the variable signal is one of a variable current and a variable voltage, the level of which may be established by a passive element, respectively. The second circuit can be configured for applying a fixed voltage to the passive element to detect the variable current level based on current flowing in the passive element when the first and second fixed voltages are not received at the second input node. The second circuit can alternatively be configured for applying a fixed current to the passive element to detect the variable voltage level based on voltage across the passive element when the first and second fixed voltages are not received at the second input node.

In another aspect, an integrated circuit comprises an oscillator for generating an internal clock signal. The integrated circuit includes first and second pins. The first pin receives an external clock signal. The second pin may be connected selectively to one of a first fixed reference node to select a first frequency of the internal clock signal, a second fixed reference node to select a second frequency of the internal clock signal, the first frequency being higher than the second frequency, and a passive element to select a frequency based on the value of the passive element. A first circuit, coupled to the oscillator, may be configured for detecting a phase/frequency difference between the internal clock signal and the external clock signal to control the oscillator so as to synchronize the integrated circuit to the external clock signal. A second circuit, coupled to the oscillator, may be configured for setting the frequency of the internal clock signal based on whether the second pin is connected to the first fixed reference node, the second fixed reference node, and the passive element, respectively, in absence of the external clock signal.

The second pin may also be connected between the first circuit and the oscillator, and connected to a filter so that the first circuit, oscillator and filter constitute a phase-locked loop when the external clock signal is applied to the first pin.

Additional aspects and advantages of the present disclosure will become readily apparent to those skilled in the art from the following detailed description, wherein only exemplary embodiments of the present disclosure is shown and described, simply by way of illustration of the best mode contemplated for carrying out the present disclosure. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

DETAILED DESCRIPTION

Figure 7:
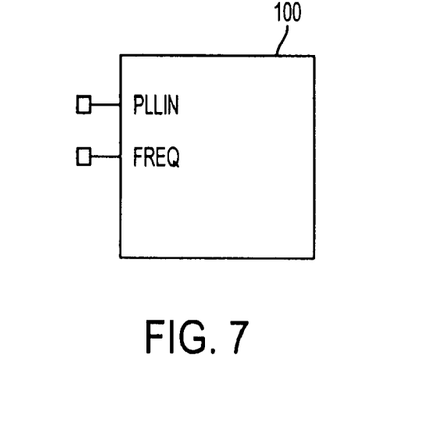
FIG. 7 is an exemplary schematic view of an IC package with PLLIN and FREQ pins, according to one embodiment of the disclosure.
Figure 8A:
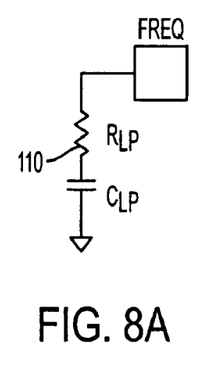
FIGS. 8A to 8F are circuit diagrams exemplary showing what can be connected to the FREQ pin of the IC shown in FIG. 7.
Figure 8B:
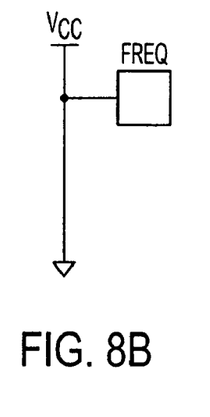
Figure 8C:
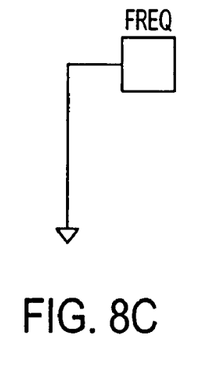
Figure 8D:
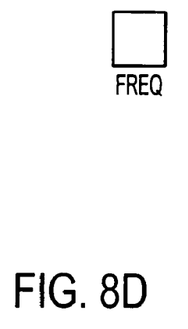
Figure 8E:
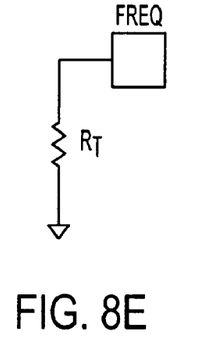
Figure 8F:
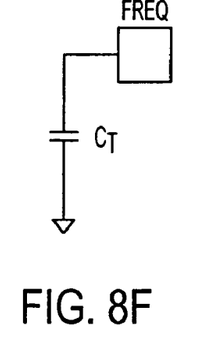

FIG. 7 illustrates one embodiment of an IC 100 including circuitry to set the IC's operating frequency. The circuitry can operate under any of (1) PLL mode, (2) tri-state mode, and (3) passive element setting mode, as explained above. In this embodiment, a FREQ pin may commonly be used for the three modes to set the IC's operating frequency. For example, when the operating frequency is set under the PLL mode, a filter 110 in FIG. 8A comprising a resistor $R_{LP}$ and capacitor $C_{LP}$ is connected to the FREQ pin. When the operating frequency is set under the tri-state mode, the FREQ pin is connected to a high supply voltage such as a voltage $V_{CC}$ (FIG. 8B) or low supply voltage, such as ground (FIG. 8C), or the pin is open (FIG. 8D). When the passive element setting mode is selected, a resistor $R_T$ or a capacitor $C_T$ is connected to the FREQ pin (FIGS. 8E and 8F). The following table shows the relationship between inputs to the PLLIN and FREQ pins (terminals, nodes) and the internal clock.

| PLLIN | FREQ | Frequency |
|---|---|---|
| External clock | R-C to GND | Phase-locked to external clock |
| — | Tied to GND | $f_{lo}$ |
| — | Float | $f_{mid}$ |
| — | Tied to Vcc | $f_{hi}$ |
| — | $R_T$ or $C_T$ to GND | Frequency proportional to $1/R_T$ or $1/C_T$ |

Figure 9:
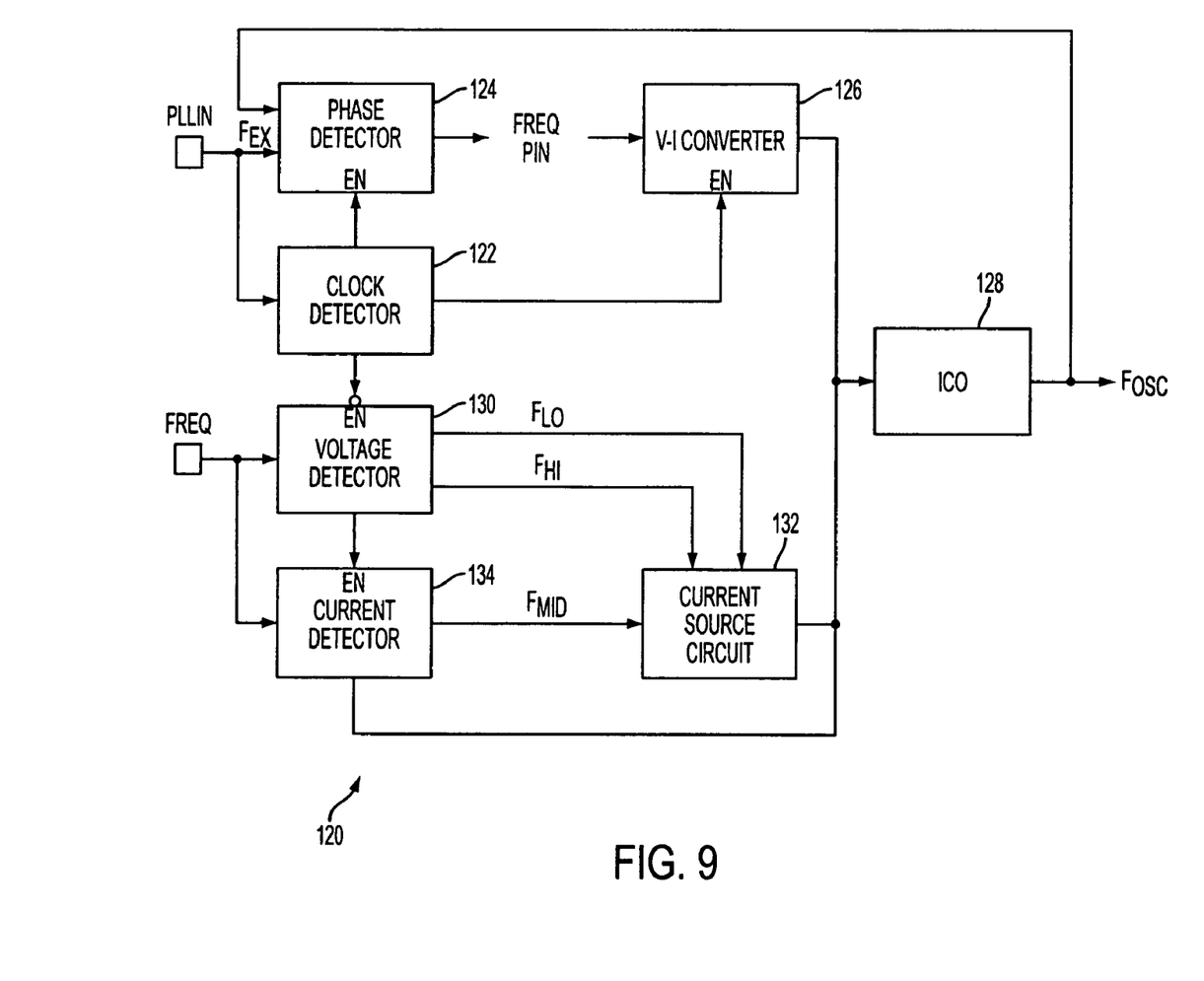
FIG. 9 is a block diagram exemplary illustrating circuitry for setting an operating frequency of an IC, included in the package shown in FIG. 7.

Referring to FIG. 9, circuitry 120 in IC 100 is connected to the PLLIN and FREQ pins. Circuitry 120 may include a clock detector 122 for detecting an external clock $F_{EX}$ at the PLLIN pin, and in response activating a phase detector 124 and voltage-to-current converter 126, and deactivating a voltage detector 130 when external clock $F_{EX}$ is detected. On the other hand, when no external clock $F_{EX}$ is detected, phase detector 124 and voltage-to-current converter 126 are deactivated, and voltage detector 130 is activated.

Phase detector 124 may be provided to detect a phase/frequency difference between an internal clock $F_{OSC}$ and external clock $F_{EX}$ to generate an error signal. Phase detector 124 is activated by the detection of external clock $F_{EX}$. The error signal is provided to filter 110 (see FIG. 8A) to be connected to the FREQ pin when external clock $F_{EX}$ is provided to the PLLIN pin. The error signal may be a pair of complementary current sources that charge or discharge external filter 110 which provides a voltage signal to a voltage-to-current (V-I) converter 126. The V-I converter 126 is activated by clock detector 122 when external clock $F_{EX}$ is present, and is configured to convert the voltage signal to a current signal.

Figure 10:
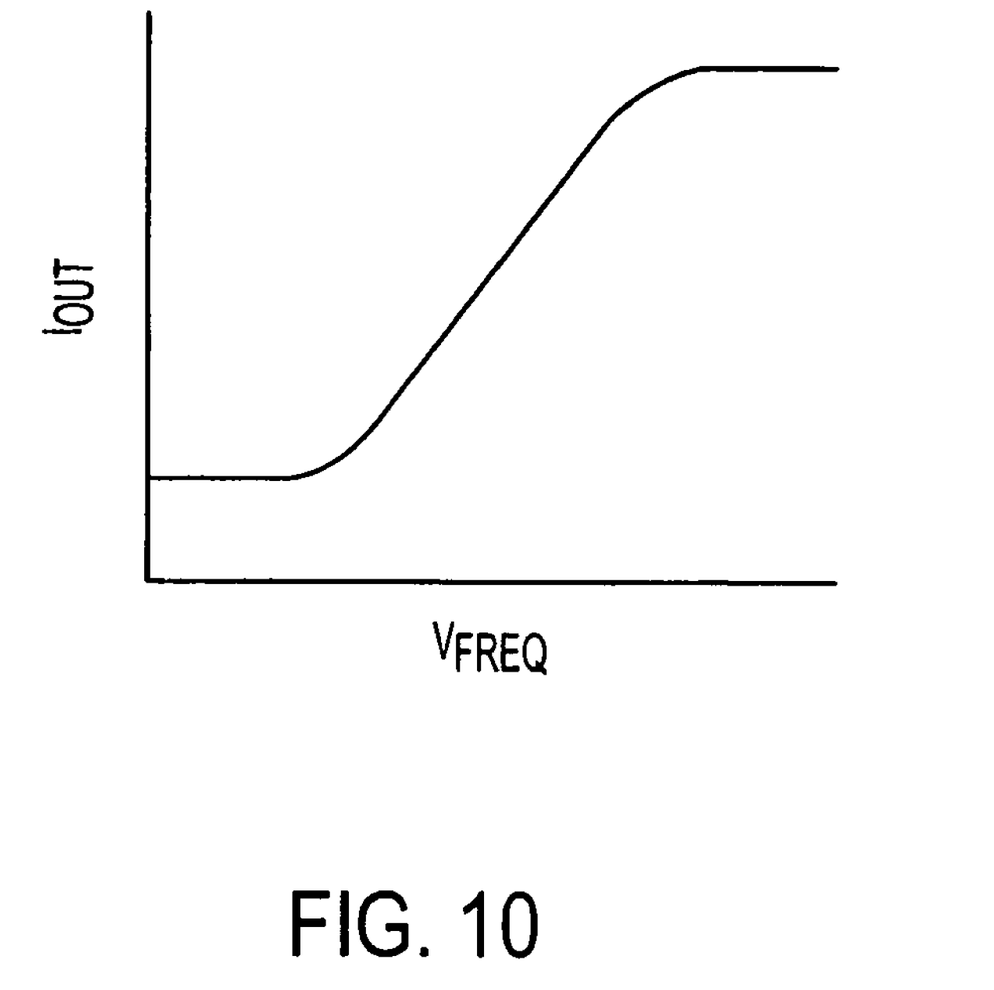
FIG. 10 is a graph exemplary showing a relationship between a voltage at the FREQ pin and a current converted from the voltage in a voltage-to-current converter in FIG. 9.

FIG. 10 is a graph showing the relationship between voltage at the FREQ pin and current converted from the voltage in V-I converter 126. The current signal is supplied to a current-controlled oscillator (ICO) 128. ICO 128 is configured for generating internal clock $F_{OSC}$ based on the current signal from V-I converter 126. Internal clock $F_{OSC}$ is proportional to magnitude of the current signal.

V-I converter 126 and ICO 128 constitute a voltage-controlled oscillator, and phase detector 124, filter 110, V-I converter 126 and ICO 128 constitute a PLL.

Circuitry 120 may include a voltage detector 130 which is activated when no external clock $F_{EX}$ is present at the PLLIN pin. Voltage detector 130 is preferably configured to detect whether a predetermined high voltage, e.g., voltage $V_{CC}$ (FIG. 8B), or a predetermined low voltage, e.g., ground (e.g., see FIG. 8C) is applied to the FREQ pin, or neither the high voltage nor the low voltage is applied to the FREQ pin (FIG. 8D). When the high voltage is detected, a control signal $F_{HI}$ is provided to a current source circuit 132, while when the low voltage is detected, a control signal $F_{LO}$ is provided to current source circuit 132. If neither the high voltage nor the low voltage is applied to the FREQ pin, a current detector 134 is then activated.

In one embodiment, voltage detector 130 may be configured to detect a low impedance connection to voltage $V_{CC}$ (FIG. 8B) and ground (FIG. 8C), rather than the absolute voltage level, in order to distinguish the case where resistor $R_T$ or capacitor $C_T$ is connected between the FREQ pin and ground (see FIGS. 8E and 8F). Accordingly, the low impedance in this example, is a low value relative to a value to be used normally for resistor $R_T$ or capacitor $C_T$. For example, assuming that resistor $R_T$ is normally in the range of 100 kΩ to 1 MΩ, the low impedance here may be less than 10 kΩ. One exemplary circuit of voltage detector 130 in this example may be configured for injecting small current into/out of the FREQ pin and measuring the resulting voltage. If there is a low impedance connection to voltage $V_{CC}$ or ground (for this example), the voltage at the FREQ pin remains close to voltage $V_{CC}$ or ground. If so, control signal $F_{HI}$ or $F_{LO}$ is provided to current source circuit 132 from voltage detector 130.

Figure 11:
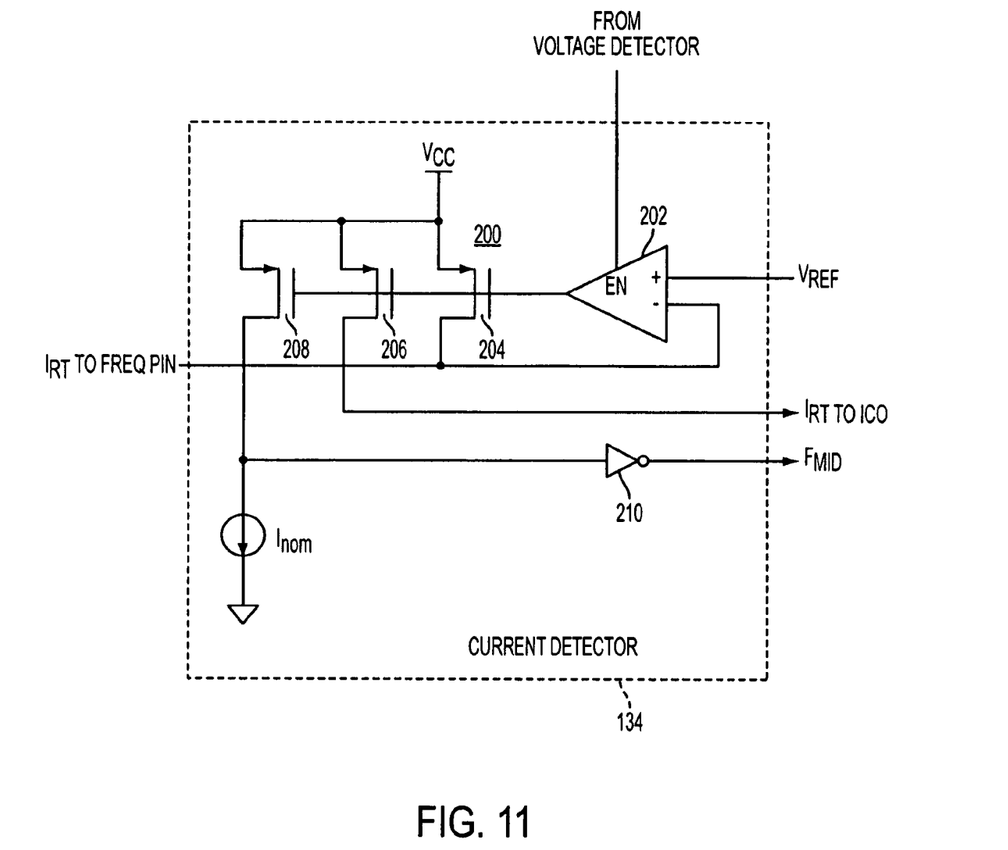
FIG. 11 is a circuit diagram showing an exemplary implementation of a current detector shown in FIG. 9.

Current detector 134 may be configured for applying a predetermined voltage to the FREQ pin to detect whether there is a current flowing from the FREQ pin to ground (or a supply rail) through resistor $R_T$ or capacitor $C_T$ with a predetermined value (FIGS. 8E and 8F). FIG. 11 is a circuit diagram showing an exemplary implementation of current detector 134. Current detector 134 includes a current mirror 200 which comprises an amplifier 202 and p-type MOS transistors 204, 206, 208. The non-inverting input of amplifier 202 is supplied with a reference voltage $V_{REF}$ (predetermined voltage) and the inverting input is connected to the drain of transistor 204. The drain of transistor 204 is also connected to the FREQ pin, to which, for example, resistor $R_T$ is connected. The drain of transistor 206 is connected to ICO 128, and that of transistor 208 is connected to current source circuit 132 through an inverter 210.

Current flowing in resistor $R_T$, i.e., a current $I_{RT}$, can be determined by the following equation.

$$I_{RT} = \frac{V_{REF}}{R_T}$$

Current $I_{RT}$ is equivalent to a drain current of each of transistors 204, 206, 208, which is controlled by amplifier 202. In FIG. 11, the voltage across the FREQ pin and ground is subtracted from reference voltage $V_{REF}$, and the result of the subtraction is amplified by amplifier 202. This amplified output from amplifier 202 controls amount of current $I_{RT}$ of each of transistors 204, 206, 208 (current $I_{RT}$ is the measured resultant current when a predetermined voltage is applied across resistor $R_T$, for example). If current $I_{RT}$ is zero or less than a nominal current $I_{nom}$) then a control signal $F_{mid}$ becomes high and is provided to current source circuit 132. No current $I_{RT}$ or current $I_{RT}$ of level less than nominal current $I_{nom}$ is determinative that the FREQ pin is open (float). On the other hand, if the level of current $I_{RT}$ is greater than that of nominal current $I_{nom}$, then current $I_{RT}$ from transistor 206 is supplied to ICO 128 as the control current to generate internal clock $F_{OSC}$ with a specific frequency proportional to amount of current $I_{RT}$.

Persons skilled in the art will appreciate based on FIGS. 9 and 11, and relevant description that current detector 134 may alternatively be configured to force a fixed current out of the FREQ pin into resistor $R_T$ or capacitor $C_T$, and measure the resultant voltage, which is then used as the voltage input to a VCO, i.e., V-I converter 126 in this example.

Figure 12:
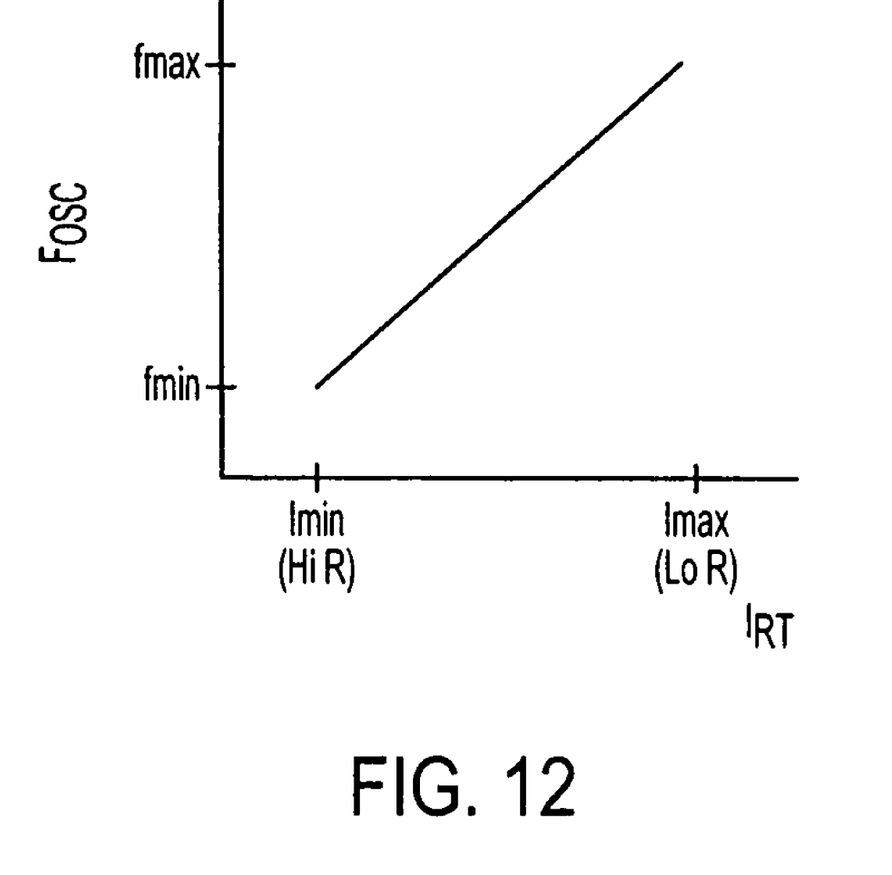
FIG. 12 is a graph exemplary showing a relationship between amount of current $I_{RT}$ and a frequency of internal clock $F_{OSC}$.

FIG. 12 is a graph showing by way of example the relationship between current $I_{RT}$ and frequency of the internal clock $F_{OSC}$. When current $I_{RT}$ is small (greater resistance $R_T$), ICO 128 generates internal clock $F_{OSC}$ with a lower frequency, while when current $I_{RT}$ is greater (smaller resistance $R_T$), ICO 128 generates the clock with a higher frequency.

Returning to FIG. 9, current source circuit 132 receives control signal $F_{HI}$ when the FREQ pin is connected to voltage $V_{CC}$ (FIG. 8B), control signal $F_{LO}$ when the FREQ pin is connected to ground (FIG. 8C) and control signal $F_{MID}$ when the FREQ pin is open (FIG. 8D) (in this example). In response, current source circuit 132 generates the control current to be supplied to ICO 128, the amount of which depends on which control signal $F_{HI}$, $F_{LO}$ or $F_{MID}$ is received.

Figure 13:
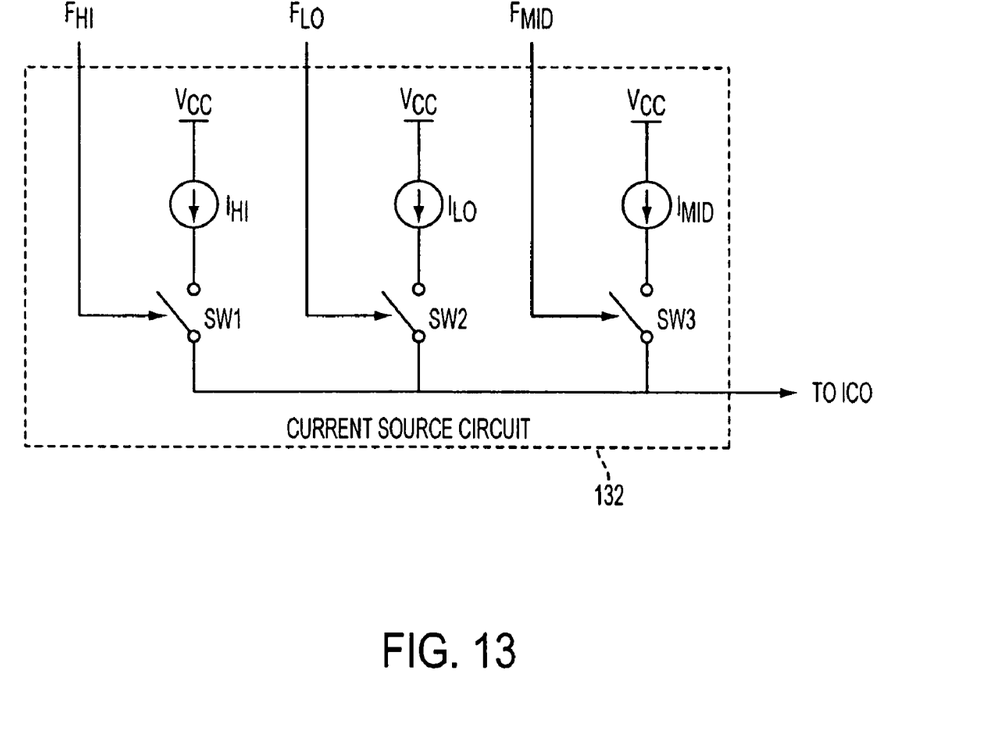
FIG. 13 is a circuit diagram showing an exemplary implementation of a current source circuit in FIG. 9.

FIG. 13 is a circuit diagram showing an exemplary implementation of current source circuit 132, which includes current sources supplying current $I_{HI}$, $I_{LO}$, $I_{MID}$, respectively, and switches SW1, SW2, SW3. The level of current $I_{HI}$ is greater than that of current $I_{MID}$, and the level of current $I_{MID}$ is greater than that of current $I_{LO}$. For example, current $I_{HI}$ is intended to select a maximum frequency $f_{max}$ to be generated by ICO 128, current $I_{LO}$ is intended to select a minimum frequency $f_{min}$, and current $I_{MID}$ is intended to select a mid range between $f_{max}$ and $f_{min}$ (see FIG. 12). When control signal $F_{HI}$ is received, then switch SW1 will be turned on and current $I_{HI}$ is supplied to ICO 128. When control signal $F_{LO}$ is received, then switch SW2 will be turned on and current $I_{LO}$ is supplied to ICO 128. Further, when control signal $F_{MID}$ is received, then switch SW3 will be turned on and current $I_{MID}$ is supplied to ICO 128.

Returning again to FIG. 9, ICO 128 generates internal clock $F_{OSC}$ with a frequency depending on magnitude of current received from V-I converter 126, current source circuit 132 and current detector 134. Internal clock $F_{OSC}$ sets the operating frequency of IC 100 and also is provided to phase detector 124 for the synchronization of the IC to external clock $F_{EX}$.

In operation, when external clock $F_{EX}$ is to be supplied to the PLLIN pin so as to synchronize IC 100 to external clock $F_{EX}$, filter 110 (FIG. 8A) is connected to the FREQ pin. In this case, circuitry 120 works as a PLL by phase detector 124, filter 110, the VCO comprising V-I converter 126 and ICO 128 (see also FIG. 2). In other words, when external clock $F_{EX}$ is determined to be present by clock detector 122, phase detector 124 and V-I converter 126 will be activated. Then, circuitry 120 operates so that IC 100 is synchronized to external clock $F_{EX}$.

If no external clock $F_{EX}$ is to be supplied to the PLLIN pin, the FREQ pin can be used to select one of three discrete operating frequencies by tying the FREQ pin, for example, to voltage $V_{CC}$ or ground, or by floating the pin (FIGS. 8B, 8C and 8D) (tri-state function). In this case, ICO 128 generates, for example, internal clock with maximum frequency $f_{max}$, mid range frequency $f_{mid}$, and minimum frequency $f_{min}$, depending on what is connected to the FREQ pin.

If no external clock $F_{EX}$ is to be supplied to the PLLIN pin, resistor $R_T$ or capacitor $C_T$ can also be connected between the FREQ pin and ground (or supply rail) to program a frequency that is inversely proportional to the resistor value or capacitance (passive element setting mode). In this case, current corresponding to resistance or capacitance generated by a predetermined voltage (e.g., $V_{REF}$ in FIG. 11) is detected by current detector 134 and current equivalent to the detected one is supplied to ICO 128 for generation of internal clock $F_{OSC}$ with a frequency proportional to the detected current.

Based on the forgoing, it is apparent that (1) PLL mode, (2) tri-state mode, and (3) passive element setting mode can be performed in an IC only with the PLLIN pin and FREQ pin. This scheme can be applied to any ICs including a DC-DC switching regulator.

Having described embodiments, it is noted that modifications and variations can be made by persons skilled in the art in light of the above teachings. It is therefore to be understood that changes may be made in the particular embodiments disclosed that are within the scope and sprit of the disclosure as defined by the appended claims and equivalents.

What is claimed is:

1. System for controlling the frequency of an oscillator, comprising:
   a first circuit coupled to the oscillator and arranged for receiving an externally provided clock signal at a first input node to control the frequency of the oscillator; and
   a second circuit coupled to the oscillator and arranged for receiving an externally provided frequency reference input at a second input node to control the frequency of the oscillator,
   wherein the frequency reference input is selectively at one of (a) a first or second fixed voltage of level designating a first or second oscillator frequency, respectively, and (b) a variable signal designating an oscillator frequency, and
   the second circuit controls the frequency of the oscillator to be a third oscillator frequency if no frequency reference input is received at the second input node.

2. The system according to claim 1, wherein
   in absence of a clock signal received at the first input node, the second circuit uses the frequency reference input received at the second input node to control the frequency of the oscillator.

3. The system according to claim 2, further comprising
   a signal detector for detecting the clock signal at the first input node, activating the first circuit when the clock signal is detected, and activating the second circuit when no clock signal is detected.

4. The system according to claim 1, wherein
   the second input node is adapted to be connected to a filter when the externally provided clock signal is provided at the first input node,
   the first circuit is coupled to the oscillator through the second input node and configured for detecting a phase/frequency difference between the externally provided clock signal and an internal clock signal to be generated by the oscillator, and
   the first circuit, filter and oscillator constitute a phase-locked loop to synchronize the internal clock signal to the externally provided clock signal.

5. The system according to claim 1, wherein
the first and second fixed voltages are at power supply voltage and ground levels, respectively, and the variable signal is one of a variable current and a variable voltage, the level of which are established by a passive element, respectively.

6. The system according to claim 5, wherein
the second circuit applies a fixed voltage to the passive element to detect the variable current level based on current flowing in the passive element when the first and second fixed voltages are not received at the second input node.

7. The system according to claim 5, wherein
the second circuit applies a fixed current to the passive element to detect the variable voltage level based on voltage across the passive element when the first and second fixed voltages are not received at the second input node.

8. The system according to claim 1, wherein the first, second, and third frequencies have prescribed different values, respectively.

9. An integrated circuit comprising:
an oscillator for generating an internal clock signal;
a first pin for receiving an external clock signal;
a second pin for connection selectively to one of a first fixed reference node to select a first frequency of the internal clock signal, a second fixed reference node to select a second frequency of the internal clock signal, and a passive element to select a frequency based on the value of the passive element;
a first circuit, coupled to the oscillator, configured for detecting a phase/frequency difference between the internal clock signal and the external clock signal to control the oscillator so as to synchronize the integrated circuit to the external clock signal; and
a second circuit, coupled to the oscillator, configured for setting the frequency of the internal clock signal based on whether the second pin is connected to the first fixed reference node, the second fixed reference node, and the passive element, selectively, in absence of the external clock signal.

10. The integrated circuit according to claim 9, wherein
the second pin is connected between the first circuit and the oscillator, and connected to a filter so that the first circuit, oscillator and filter constitute a phase-locked loop when the external clock signal is applied to the first pin.

11. An integrated circuit comprising:
an oscillator for generating an internal clock signal;
a first pin for receiving an external clock signal;
a second pin for connection selectively to one of a first fixed reference node to select a first frequency of the internal clock signal, a second fixed reference node to select a second frequency of the internal clock signal, and a passive element to select a frequency based on the value of the passive element;
a first circuit, coupled to the oscillator, configured for detecting a phase/frequency difference between the internal clock signal and the external clock signal to control the oscillator so as to synchronize the integrated circuit to the external clock signal; and
a second circuit, coupled to the oscillator, configured for setting the frequency of the internal clock signal based on whether the second pin is connected to the first fixed reference node, the second fixed reference node, and the passive element, selectively, in absence of the external clock signal, wherein
the second circuit controls the frequency of the oscillator to be a third frequency when the second pin is not connected to the first fixed reference node, the second fixed reference node, and the passive element.

12. The integrated circuit according to claim 11, wherein
the second pin is connected between the first circuit and the oscillator, and connected to a filter so that the first circuit, oscillator and filter constitute a phase-locked loop when the external clock signal is applied to the first pin.

13. The integrated circuit according to claim 11, wherein the first, second, and third frequencies have prescribed different values, respectively.

* * * * *